(12) United States Patent
Schäfer et al.

(10) Patent No.: US 7,123,523 B2
(45) Date of Patent: Oct. 17, 2006

(54) INTEGRATED CIRCUIT HAVING AN INPUT CIRCUIT

(75) Inventors: Andre Schäfer, München (DE); Kazimierz Szczypinski, München (DE); Jens Polney, München (DE)

(73) Assignee: Infineon Technologies AG, Munich (DE)

( * ) Notice: Subject to any disclaimer, the term of this patent is extended or adjusted under 35 U.S.C. 154(b) by 226 days.

(21) Appl. No.: 10/670,662

(22) Filed: Sep. 25, 2003

(65) Prior Publication Data

US 2004/0056693 A1    Mar. 25, 2004

(30) Foreign Application Priority Data

Sep. 25, 2002  (DE) ................. 102 44 516

(51) Int. Cl.
*G11C 7/00*        (2006.01)
(52) U.S. Cl. ............... 365/191; 365/189.05; 365/193
(58) Field of Classification Search ........... 365/191, 365/189.05, 193, 230.08, 189.01; 326/21; 327/379
See application file for complete search history.

(56) References Cited

U.S. PATENT DOCUMENTS

| | | | |
|---|---|---|---|
| 4,096,584 A | 6/1978 | Owen, III et al. | |
| 5,305,261 A * | 4/1994 | Furutani et al. | 365/189.01 |
| 5,761,136 A * | 6/1998 | Park et al. | 365/191 |
| 5,894,229 A | 4/1999 | Yamaoka et al. | |
| 5,903,508 A | 5/1999 | Choi | |
| 6,137,320 A | 10/2000 | Takai | |
| 6,330,186 B1 * | 12/2001 | Tanaka | 365/185.11 |
| 6,339,343 B1 | 1/2002 | Kim et al. | |
| 6,480,039 B1 | 11/2002 | Feurle | |
| 6,603,684 B1 * | 8/2003 | Im | 365/189.05 |
| 2002/0191480 A1 | 12/2002 | Matsumoto et al. | |

FOREIGN PATENT DOCUMENTS

| | | |
|---|---|---|
| DE | 199 56 465 A1 | 5/2000 |
| DE | 199 44 248 A1 | 3/2001 |
| DE | 102 20 968 A1 | 1/2003 |

* cited by examiner

*Primary Examiner*—David Lam
(74) *Attorney, Agent, or Firm*—Laurence A. Greenberg; Werner H. Stemer; Ralph E. Locher

(57) ABSTRACT

An integrated circuit, in particular an integrated memory circuit, has an input circuit for the purpose of receiving a signal. The input circuit has an activation input for an activation signal in order to activate the input circuit, in a manner dependent on the activation signal, for the purpose of receiving signals.

10 Claims, 2 Drawing Sheets

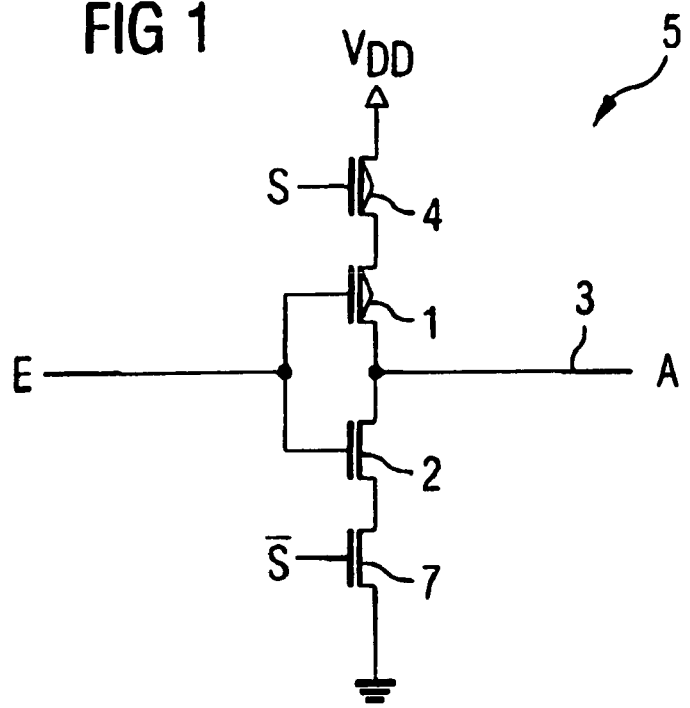
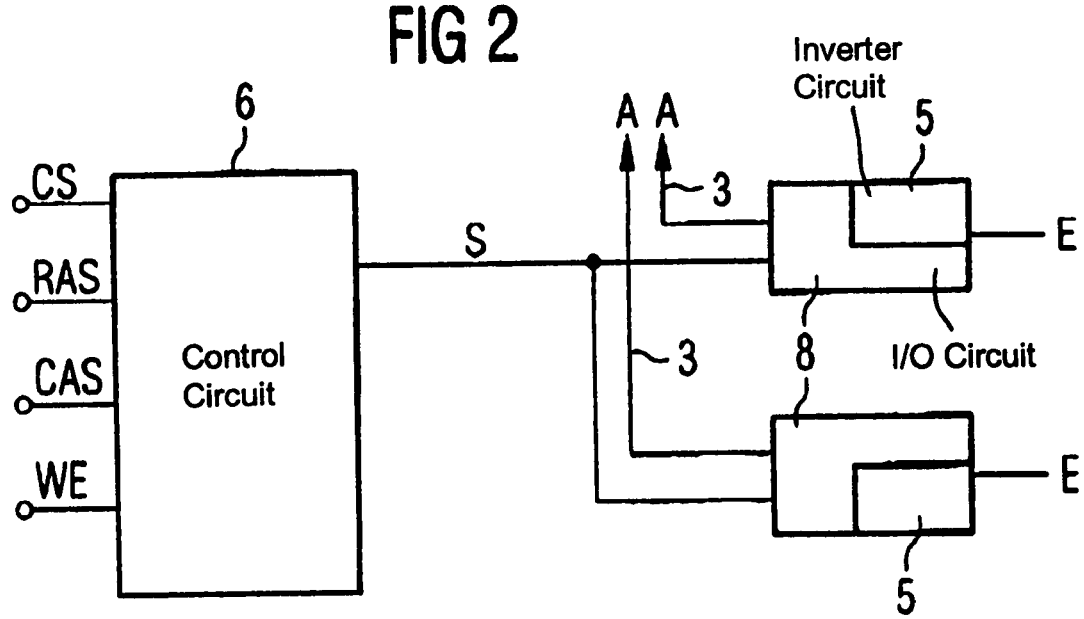

INTEGRATED CIRCUIT HAVING AN INPUT CIRCUIT

BACKGROUND OF THE INVENTION

Field of the Invention

The invention relates to an integrated circuit having an input circuit for receiving signals.

Integrated circuits usually have signal inputs and signal outputs. For the purpose of receiving external signals, the signal inputs are provided with input circuits, which are used to receive an externally applied signal and make the signal available to on-chip circuits.

In the simplest case, input circuits of this type contain an inverter having two complementary transistors, which are connected in series and to control inputs of which the input signal is respectively applied. The inverted input signal may be tapped off at a center connection of the transistors, which is to say between the two transistors.

A switching current, which increases the current consumption of the integrated circuit, flows through an input circuit, in particular when an input signal that is present at the input circuit changes state. Input circuits that have a quiescent current consumption may also be provided, with the result that the current consumption of the input circuit concomitantly determines the overall current consumption of the integrated circuit to a significant extent.

However, input signals may also be present at the inputs of the integrated circuit when the input signals are intended to be used for another integrated circuit, for example when a plurality of integrated circuits are connected to a bus system, in which case a bus line is connected to each of the connected integrated circuits by a corresponding input in each case. In this case, all of the connected input circuits are active and detect the applied input signal without the input signal resulting in a function being triggered in the integrated circuits that have not been addressed. This distinctly increases the current consumption, particularly in an overall system in which a relatively large number of integrated circuits are connected, by way of their inputs, to a bus system.

SUMMARY OF THE INVENTION

It is accordingly an object of the invention to provide an integrated circuit having an input circuit that overcomes the above-mentioned disadvantages of the prior art devices of this general type, which reduces the current consumption of the integrated circuit.

With the foregoing and other objects in view there is provided, in accordance with the invention, an integrated circuit. The integrated circuit contains an input circuit for receiving a signal. The input circuit has an activation input for receiving an activation signal to activate the input circuit, in a manner dependent on the activation signal, for receiving signals.

According to the invention, an integrated circuit has thus been provided with an input circuit which can be deactivated, with the result that the input circuit does not draw any quiescent current and, respectively, does not draw any switching current as a result of the detection of the applied signal, which currents load the power supply, even though the input signal is not required in the integrated circuit in question.

Provision may preferably be made for the input circuit to be connected in such a manner that the input circuit may be switched on or off with the aid of the activation signal. That is to say, the input circuit is connected to the power supply or disconnected therefrom depending on the activation signal. This makes it possible, in a very effective manner, to deactivate the input circuit and thus ensure that no current flows through the input circuit when the input signal changes state.

Provision may be made for the input circuit to be contained in a bidirectional input/output circuit. It is frequently the case with bidirectional input/output circuits that the input circuit, which is connected to the respective external terminal in parallel with the output driver, is concomitantly driven when driving an output signal with the aid of the output driver. The input circuit then receives the signal which has been driven onto the output line and makes it available at the output node of the input circuit, which node, in this case, is decoupled from the circuits in the integrated circuit, with the result that the signal does not trigger a function. Increased current drawing is thus also affected in a bidirectional input/output circuit when signals from the integrated circuit are to be driven onto an external line.

Provision is preferably made for the input circuit to be a data input for a memory circuit, in which case a control circuit is provided for generating the activation signal. The control circuit generates the activation signal when data are to be written to the memory circuit via the input circuit. Provision is therefore made for the input circuits of the memory circuit to be activated only when data are being received, for example via an external data bus, whereas data inputs are deactivated or switched off when the memory circuit is being operated otherwise.

Since the process of writing data to the memory circuit can be detected with the aid of control signals, such as, for example, the memory select signal, the word line activation signal, the bit line activation signal and/or the write signal, the activation signal may be generated in a manner dependent on these signals, with the result that the input circuits can be switched off when reading from the memory circuit. If the aforementioned signals indicate that the intention is then to write to the memory circuit, the input circuits of the integrated circuit are switched on by the activation signal generated by the control circuit.

A further aspect of the present invention provides a method for switching an input circuit, in particular for an integrated memory circuit, in which the input circuit is activated when a write access is intended to be made to the integrated memory circuit, and in which the input circuit is deactivated when a write access is not intended to be made to the integrated memory circuit.

Other features which are considered as characteristic for the invention are set forth in the appended claims.

Although the invention is illustrated and described herein as embodied in an integrated circuit having an input circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of an input circuit for an integrated circuit according to the invention;

FIG. 2 is a block diagram of a control circuit for generating an activation signal;

DESCRIPTION OF THE PREFERRED EMBODIMENTS

Figure 3:
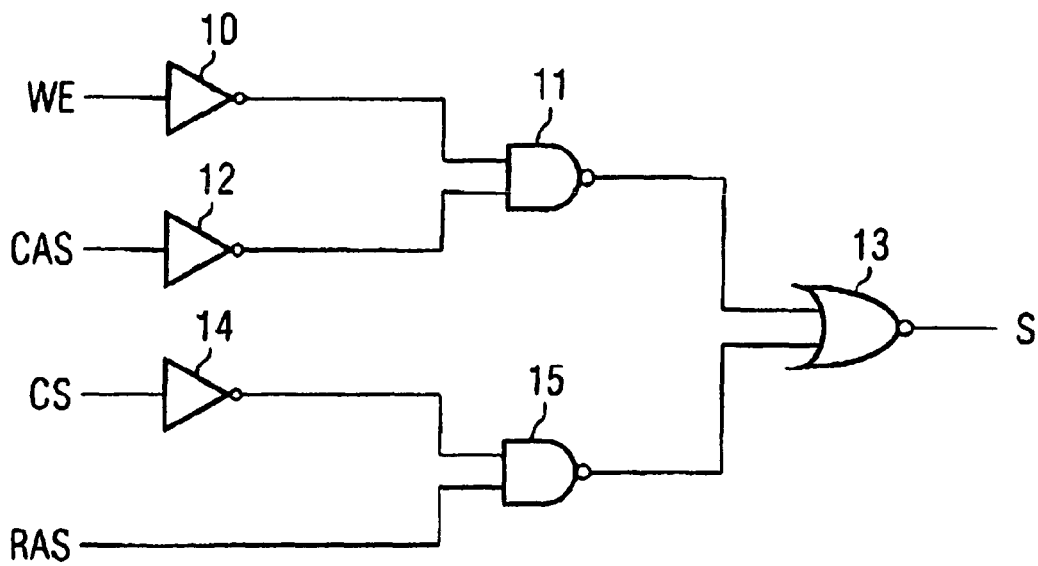
FIG. 3 is a circuit diagram for the control circuit for generating the activation signal.

Referring now to the figures of the drawing in detail and first, particularly, to FIG. 1 thereof, there is shown one possible embodiment of an inventive input circuit. The input circuit has an inverter circuit 5 having a first p-channel transistor 1 and a first n-channel transistor 2. The first p-channel transistor 1 and the first n-channel transistor 2 are connected in series, control inputs of the transistors being connected to an input signal E to be received.

A first terminal of the first p-channel transistor 1 is connected to an output line 3 onto which an inverted and amplified input signal E is driven as an output signal A. A second terminal of the p-channel transistor 1 is connected to a supply voltage potential VDD via a switch 4. The switch 4 may be controlled by an activation signal S. The switch is preferably in the form of a second p-channel transistor 4, the activation signal being applied to a control input of the second p-channel transistor 4.

The first n-channel transistor 2 is likewise connected to the output line 3 by way of a first terminal. A second terminal of the first n-channel transistor 2 is connected to a first terminal of a second n-channel transistor 7, the second terminal of which is connected to ground potential GND. The second n-channel transistor 7 may be controlled by the inverted activation signal $\overline{S}$.

Conventional input circuits are frequently in the form of an inverter, a current flowing momentarily between the supply voltage potential VDD and the ground potential GND when the state level of the input signal changes. Although an inverter circuit of this type has a small quiescent current, the latter cannot be ignored when there is a relatively large number of input circuits of this type, and the current consumption of an inverter circuit of this type increases considerably, in particular in the case of frequently changing input signals.

The fact that input circuits of this type are continuously connected to input signals, even if the input signals are not intended to be used in the integrated circuit, results in that, for each change in the state level of the input signal, a current flows momentarily between the supply voltage potential VDD and the ground potential GND, and a current flows via the output line in order to reverse the charge of the capacitances of the inputs connected to the output line. If the input circuits are constructed differently, the quiescent current is also greater, with the result that input circuits of this type may load the voltage supplies to a greater extent.

The input circuit may be decoupled from the supply voltage with the aid of the second p-channel transistor 4 and the second n-channel transistor 7, with the result that no current flows through the input circuit even when an input signal is present. As a result, the power consumption of the integrated circuit may be minimized.

The activation signal S is configured in such a manner that it applies the supply voltage VDD to the input circuit only when the signal that has been detected by the input circuit and has been driven onto the output line 3 is to be used in the integrated circuit.

This allows energy to be saved, in particular when a plurality of integrated circuits are connected to an input signal via a common bus system. If the integrated circuits are operated alternately rather than simultaneously, only one or some of the integrated circuits is/are respectively ever activated, even though all of the corresponding input circuits are connected to the signal lines of the bus system. The input circuits of all the integrated circuits (that are connected to the signal lines of the bus system) switch each time the relevant signal changes and consume power. An advantage of the inventive circuit is that it is possible to deactivate the input circuits, so that the latter do not amplify the signal when it is not being used inside the integrated circuit.

FIG. 2 illustrates a block diagram illustrating the process of driving input circuits of a memory module with the aid of a control circuit. In this case, the input signals E in the input circuit 5 are driven, under the control of the control circuit 6, onto the output lines 3 as output signal A.

The control circuit 6 generates the activation signal S, which is made available to each of the input circuits that are to be capable of being deactivated. The control circuit 6 has four inputs, to which a memory select signal CS, a word line activation signal RAS, a bit line activation signal CAS and a write signal WE are applied. The input circuits 5 are input circuits for data signals and may be contained in a bidirectional input/output circuit 8.

Depending on the memory select signal CS, the word line activation signal RAS, the bit line activation signal CAS and the write signal WE, the control circuit 6 decides whether the input circuits 5 are activated or deactivated, that is to say decoupled from the supply voltage VDD.

FIG. 3 illustrates a circuit diagram of one possible embodiment of the control circuit 6. In the embodiment illustrated, the input signals are active low signals, that is to say a function is activated when the respective signal changes from the high state to the low state.

The write signal is applied to an inverter 10, the output of which is connected to a first input of a first NAND gate 11. The bit line activation signal CAS is connected to a second input of the NAND gate 11 via a second inverter 12. The output of the first NAND gate 11 is connected to a first input of a NOR gate 13. The memory select signal CS is connected to a first terminal of a second NAND gate 15 via a third inverter 14. The word line activation signal RAS is connected to a second terminal of the second NAND gate 15. An output of the second NAND gate 15 is connected to a second input of the NOR gate 13. The activation signal S is present at the output of the NAND gate 13.

Figure 4:
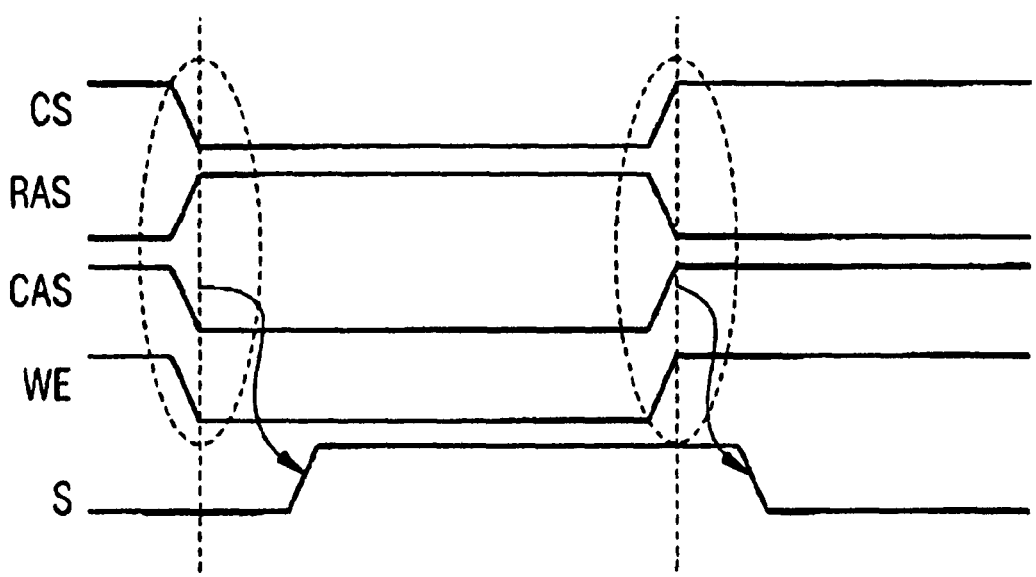
FIG. 4 is a signal timing diagram illustrating the generation of the activation signal.

FIG. 4 illustrates a signal timing diagram for the control circuit 6 shown in FIG. 3, the timing diagram illustrating the manner in which the process of generating the activation signal depends on the memory select signal CS, the word line activation signal RAS, the bit line activation signal CAS and the write signal WE. The activation signal S is generated when a write access is present and data are to be written to the memory circuit. In this case, the input circuits must be activated in order to accept the data from a data bus.

The activation signal S is generated when the process of activating the word lines has been completed and the data are to be written to the memory cells via the read/write amplifiers. The word lines are activated by the word line activation signal RAS. The process concludes when the RAS signal changes from the low state to the high state. Subsequently or simultaneously, the bit line activation signal CAS is changed from the high state to the low state, as a result of which the read/write amplifiers are activated for the purpose of writing the data to the memory cells. The read/write amplifiers that have been addressed are selected by the y-address that has been accepted with the aid of the bit line activation signal and is present at the address inputs of the memory circuit.

As soon as the bit line activation signal CAS is activated, the input circuits are switched on by the activation signal S, with the result that data may be accepted into the memory circuit from the data bus. If the bit line activation signal CAS is deactivated, the activation signal S is deactivated after a short delay time caused by the signal propagation time of the circuit illustrated in FIG. 3, with the result that the input circuits can no longer receive signals present on the data bus.

The use of a circuit of this type is particularly expedient in memory circuits, since a plurality of memory circuits are frequently connected to a single data bus and are selected individually by the memory select signal CS. The remaining memory circuits are likewise connected to the data bus and receive the data to be written to one of the memory circuits at their inputs, in particular at their data inputs, even though the data are not used. As a result of the input circuits being switched off, the reception of the input signals by the input circuits and the driving of the input signals onto signal lines within the integrated circuits are avoided by the input circuit being decoupled from the supply voltage.

We claim:

1. An integrated circuit, comprising:
   a bidirectional input/output circuit; and
   an input circuit for receiving a signal, said input circuit having an activation input for receiving an activation signal to activate said input circuit, in a manner dependent on the activation signal, for receiving signals, said input circuit being contained in said bidirectional input/output circuit;
   said input circuit being deactivated based on said activation signal such that the deactivated input circuit does not draw any quiescent or switching current as a result of the detection of received signals.

2. The integrated circuit according to claim 1, wherein said input circuit may be switched on or off with an aid of the activation signal.

3. The integrated circuit according to claim 1,
   wherein said input circuit has a data input for a memory circuit; and
   further comprising a control circuit for generating the activation signal, said control circuit generating the activation signal when data are to be written to the memory circuit through said input circuit.

4. The integrated circuit according to claim 1, wherein the integrated circuit is an integrated memory circuit.

5. An integrated circuit, comprising:
   an input circuit for receiving a signal, said input circuit having a data input for a memory circuit and an activation input for receiving an activation signal to activate said input circuit, in a manner dependent on the activation signal, for receiving signals, said input circuit being contained in a bidirectional input/output circuit;
   said input circuit being deactivated based on said activation signal such that the deactivated input circuit does not draw any quiescent or switching current as a result of the detection of received signals; and
   a control circuit for generating the activation signal, said control circuit generating the activation signal when data are to be written to the memory circuit through said input circuit;
   said control circuit generating the activation signal in a manner dependent on at least one of the following signals:
   a circuit select signal;
   a word line activation signal;
   a bit line activation signal; and
   a write signal.

6. The integrated circuit of claim 5, wherein said control circuit activates or deactivates said activation signal following a time delay after a change in signal level of at least one of the following signals:
   a circuit select signal;
   a word line activation signal;
   a bit line activation signal; and
   a write signal.

7. A method for activating an input circuit for an integrated circuit, which comprises the step of:
   providing an integrated circuit according to claim 1;
   activating the input circuit if a write access has been made to the integrated circuit; and
   deactivating the input circuit if the write access has not been made to the integrated circuit.

8. An integrated circuit, comprising:
   an input circuit for receiving a signal, said input circuit having a data input for a memory circuit and an activation input for receiving an activation signal to activate said input circuit, in a manner dependent on the activation signal, for receiving signals; and
   a control circuit for generating the activation signal, said control circuit generating the activation signal when data are to be written to the memory circuit through said input circuit;
   said control circuit including:
      at least a first logic device producing a first output related to the signal levels of a write signal and a bit line activation signal;
      at least a second logic device producing a second output related to the signal levels of a memory select signal and a word line activation signal; and
      at least a third logic device generating said activation signal based on said first output and said second output.

9. The integrated circuit of claim 8, wherein said control circuit activates or deactivates said activation signal following a time delay after a change in signal level of at least one of the following signals:
   a circuit select signal;
   a word line activation signal;
   a bit line activation signal; and
   a write signal.

10. An integrated circuit, comprising:
    an input circuit for receiving a signal, said input circuit having a data input for a memory circuit and an activation input for receiving an activation signal to activate said input circuit, in a manner dependent on the activation signal, for receiving signals; and
    a control circuit for generating the activation signal, said control circuit generating the activation signal when data are to be written to the memory circuit through said input circuit;

said control circuit including:
  a first inverter for receiving and inverting a write signal;
  a second inverter for receiving and inverting a bit line activation signal;
  a first NAND gate for receiving the inverted write signal and the inverted bit line activation signal, and producing a first output;
  an inverter for receiving and inverting a memory select signal;
  a second NAND gate for receiving the inverted write signal and for receiving a word line activation signal, said second NAND gate producing a second output; and
  a NOR gate for receiving said first output and said second output and for generating an activation signal based on said first and second outputs.

* * * * *